United States Patent
Ju

(10) Patent No.: US 11,152,382 B2
(45) Date of Patent: Oct. 19, 2021

(54) SEMICONDUCTOR ONE-TIME PROGRAMMABLE MEMORY FOR NANOMETER CMOS

(71) Applicant: Donghyuk Ju, San Jose, CA (US)

(72) Inventor: Donghyuk Ju, San Jose, CA (US)

(*) Notice: Subject to any disclaimer, the term of this patent is extended or adjusted under 35 U.S.C. 154(b) by 0 days.

(21) Appl. No.: 16/920,717

(22) Filed: Jul. 5, 2020

(65) Prior Publication Data
US 2021/0125999 A1   Apr. 29, 2021

Related U.S. Application Data

(60) Provisional application No. 62/927,004, filed on Oct. 28, 2019.

(51) Int. Cl.
| | |
|---|---|
| *H01L 27/108* | (2006.01) |
| *H01L 21/8242* | (2006.01) |
| *H01L 27/112* | (2006.01) |
| *H01L 29/423* | (2006.01) |
| *H01L 27/092* | (2006.01) |
| *H01L 29/06* | (2006.01) |
| *H01L 29/80* | (2006.01) |

(52) U.S. Cl.
CPC .... *H01L 27/11206* (2013.01); *H01L 27/0924* (2013.01); *H01L 29/0619* (2013.01); *H01L 29/42356* (2013.01); *H01L 29/80* (2013.01)

(58) Field of Classification Search
CPC .................. H01L 29/0619; H01L 29/80; H01L 2924/1203
USPC .................. 438/250, 253; 257/298, 300, 350
See application file for complete search history.

(56) References Cited

U.S. PATENT DOCUMENTS

| | | | |
|---|---|---|---|
| 6,287,911 B1 * | 9/2001 | Nobusawa | ...... H01L 21/823443 438/241 |
| 6,611,040 B2 | 8/2003 | Gelsomini et al. | |
| 6,867,106 B2 * | 3/2005 | Yamaguchi | ....... H01L 29/41733 438/331 |
| 7,102,951 B2 | 9/2006 | Paillet et al. | |
| 7,110,278 B2 | 9/2006 | Keshavarzi et al. | |
| 7,656,738 B2 | 2/2010 | Namekawa | |
| 7,678,620 B2 | 3/2010 | Hoefler | |
| 7,755,162 B2 | 7/2010 | Kurjanowicz et al. | |
| 8,258,586 B1 | 9/2012 | Mitchell et al. | |
| 8,330,189 B2 | 12/2012 | Luan et al. | |
| 8,476,157 B2 | 7/2013 | Lung | |
| 9,142,316 B2 | 9/2015 | Liu et al. | |
| 9,953,705 B2 * | 4/2018 | Bedau | ................. H01L 45/1253 |
| 10,020,346 B2 * | 7/2018 | Bedau | ................. H01L 45/1608 |

OTHER PUBLICATIONS

Liu, "Anti-Fuse Memory Array Embedded in 14nm FinFET CMOS with Novel Selector-Less Bit-Cell Featuring Self-Rectifying Characteristics", 2014 Symposium on VLSI Technology, Digest of Technical Papers, IEEE.

\* cited by examiner

*Primary Examiner* — Calvin Lee

(57) ABSTRACT

An antifuse OTP memory bit cell comprises a gate electrode, a gate dielectric and source/drain diffusions formed in an active area of a semiconductor substrate. The source/drain diffusions are connected under the gate electrode by lateral diffusion but they don't have to be. If connected, a rectifying contact is created in a programmed bit cell. If unconnected, a rectifying contact or a non-rectifying contact is created in a programmed bit cell. Whether connected or unconnected, the device operates as an OTP memory bit cell without an access transistor.

18 Claims, 15 Drawing Sheets

_US 11,152,382 B2_

SEMICONDUCTOR ONE-TIME PROGRAMMABLE MEMORY FOR NANOMETER CMOS

CROSS REFERENCE TO RELATED APPLICATIONS

This application claims the benefit of U.S. provisional application No. 62/927,004 filed on Oct. 28, 2019.

FIELD OF THE INVENTION

The present invention relates generally to semiconductor memory, and more specifically, to antifuse one-time programmable memory.

BACKGROUND OF THE INVENTION

Antifuse is an electrical device that conducts little current through it in unprogrammed state and conducts current when programmed. The electrical characteristics of an antifuse in unprogrammed and programmed states are opposite to those of a fuse, and hence the name antifuse. The non-conducting and conducting states of an antifuse can be used to store digital data "0" and "1", i.e., an antifuse can be used to build a semiconductor memory.

One method to fabricate an antifuse in an integrated circuit chip is to sandwich a thin dielectric layer between two conducting material. In a fresh antifuse, i.e., in an antifuse in unprogrammed state, the dielectric layer blocks current flow between the two conducting material, or electrodes. Programming of an antifuse is accomplished by applying a voltage between the two electrodes that is high enough to cause the dielectric to break down. After dielectric breakdown, antifuse can conduct current, i.e., the antifuse is in programmed state.

Programming of an antifuse permanently changes its electrical property. Once programmed, an antifuse cannot revert back to unprogrammed state. Therefore, a memory fabricated with an antifuse can be programmed only once; hence it is a one-time programmable (OTP) memory like electrical fuse and mask read-only memory (ROM). Antifuse OTP memory retains data after power is turned off so it belongs to a group of semiconductor memories classified as non-volatile memory.

Antifuse OTP memory is embedded in integrated circuit chips to store program codes, security codes, to trim analog circuits and to repair dynamic random-access memory (DRAM) or static random-access memory (SRAM), just to name a few. It is an important component of digital, analog and mixed signal integrated circuits and used extensively in consumer, industrial, automotive and internet-of-things applications.

In complementary metal-oxide-semiconductor (CMOS) process—the mainstream integrated circuits manufacturing process today—OTP memory bit cell typically takes the form of one-transistor-one-capacitor (1T1C) wherein a MOS capacitor is used as an antifuse and a MOS field-effect-transistor (MOSFET) is an access device. The advantages of 1T1C OTP memory over other types of OTP memory, electrical fuse for example, are a small bit cell size, high reliability, excellent data security, and ease of user programmability and scalability.

In CMOS integrated circuit chips, typically there exist two (or more) groups of MOSFETs in order to meet multiple operating voltage requirements; for example, low-voltage MOSFETs and high-voltage MOSFETs. Low-voltage MOSFETs are used in the interior circuits of an integrated circuit mainly for high-speed operation of digital circuits. High-voltage MOSFETs on the other hand are used in input/output (I/O) circuits to interface with off-chip devices and also in analog circuits. In an exemplary CMOS process employed herein, an N-channel low-voltage MOSFET comprises heavily-doped N-type (N+) diffusions for source and drain, N-channel low-voltage lightly-doped drain ($N_{lvldd}$), N+ gate polysilicon and a thin gate dielectric. An N-channel high-voltage MOSFET comprises N+ diffusions for source and drain, N-channel high-voltage lightly-doped drain ($N_{hvldd}$), N+ gate polysilicon and a thick gate dielectric. $N_{lvldd}$ and $N_{hvldd}$ extend N+ source/drain diffusions into the low-voltage MOSFET channel and high-voltage MOSFET channel, respectively, so that there exists an overlap of the source/drain with the gate. It is to be noted $N_{hvldd}$ is deeper and diffuses laterally into the MOSFET channel more than $N_{lvldd}$. It is also to be noted the minimum gate length allowed for the low-voltage MOSFETs can be much smaller than that of the high-voltage MOSFETs.

FIG. 1A is a schematic circuit of an exemplary antifuse 1T1C bit cell, a prior art. Inside circles 101 and 102 of FIG. 1A are shown an N-channel MOSFET and a MOS capacitor, respectively. The gates of the MOSFET and MOS capacitor are connected and serve as the word line (WL) and the source of the MOSFET is the bit line (BL). FIG. 1A illustrates schematically that the MOSFET is a high-voltage device with a thick gate dielectric and the MOS capacitor is a low-voltage device with a thin gate dielectric.

FIG. 1B is a cross-sectional drawing of FIG. 1A when fabricated in silicon. Inside circle 103 of FIG. 1B is an N-channel MOSFET comprising N+ source 104, N+ gate polysilicon 105, a thick gate dielectric 106, N+ drain 112 and a P-type substrate 100. The N+ source and drain diffusions extend into the MOSFET channel with a high-voltage lightly-doped drain ($N_{hvldd}$) 107. The MOS capacitor shown inside circle 108 of FIG. 1B comprises N+ gate polysilicon 109, a thin gate dielectric 110 and a low-voltage lightly-doped drain ($N_{lvldd}$) 111. The MOS capacitor borders the N+ drain 112 on one side and shallow trench isolation (STI) 113 on the other side.

The gate dielectric 110 of the MOS capacitor in 1T1C bit cell in FIG. 1B breaks down during programming either in the overlap region of N+ gate polysilicon with $N_{lvldd}$ or in the MOS capacitor channel as illustrated in FIG. 2. If the gate dielectric breaks down in the gate-$N_{lvldd}$ overlap region 201 in FIG. 2, N+ gate polysilicon is shorted to $N_{lvldd}$ underneath. The access MOSFET in 1T1C bit cell prevents the word line from getting shorted to the bit line. If the dielectric breakdown occurs in the MOS capacitor channel area 202, a diode formed between the N+ gate polysilicon and P-type MOS capacitor channel creates an N-channel MOSFET 203 of which the gate and drain are connected.

It is apparent in FIG. 1B that the access MOSFET in 1T1C bit cell occupies a significant portion of the total bit cell area. It is also apparent from FIG. 2 that the read current of 1T1C bit cell depends on the location of gate dielectric breakdown, which consequently causes a large read current variation in a memory array.

In order to meet the performance and cost requirements demanded by the wide-ranging OTP memory applications, it is desired to have an OTP memory bit cell that offers a small bit cell size, a tight read current distribution, low power consumption and high reliability at no extra manufacturing cost. By removing the access MOSFET from 1T1C bit cell, one can achieve some of these goals. Such attempts are disclosed in prior arts found in U.S. Pat. No. 8,330,189 by H. Luan, et al. and U.S. Pat. No. 9,142,316 by Y. Liu, et al. FIG. 3A and FIG. 3B are the cross-sectional drawings from U.S. Pat. No. 8,330,189. While a compact bit cell is possible, the bit cell therein requires additional manufacturing steps and careful optimization thereof, increasing the manufacturing cost. The bit cell disclosed in U.S. Pat. No. 9,142,316 does not require additional manufacturing steps. However, because an N-well in CMOS process is used as a bit line diffusion, a compact bit cell is not easy to achieve.

The present invention discloses an antifuse OTP memory bit cell that offers a small bit cell, a tight read current distribution, low-power, high reliability and easy scaling into nanometer (nm) CMOS nodes. It is compatible with CMOS process used to fabricate system-on-chip (SOC) integrated circuits and does not require additional manufacturing steps.

BRIEF SUMMARY OF THE INVENTION

An antifuse OTP memory bit cell comprises a MOS capacitor formed by a gate electrode, a thin dielectric and diffusion regions in an active area of a semiconductor substrate. The gate electrode can be a polysilicon or metal. Two adjacent source/drain diffusion regions separated by the gate are connected under the gate by lateral diffusion but they don't have to be. If connected, a diode is created in a programmed bit cell between the word line and bit line. If unconnected, a programmed bit cell is represented by a junction field-effect transistor (JFET) in conjunction with a diode, or only by a diode depending on the location of the gate dielectric breakdown. The diffusion regions are connected to a metal bit line and the gate is the bit line.

DETAILED DESCRIPTION OF THE INVENTION

Downscaling of CMOS integrated circuits as described in Moore's law has resulted in shrinking feature dimensions and decreasing power supply voltages over the past 50 years. The scaling, however, has taken place at unequal paces in the interior circuits and in the input/out (I/O) circuits of integrated circuits. In the interior circuits of integrated circuits wherein a high-speed operation and the reduction of power consumption are of foremost importance, scaling has proceeded as Moore's law predicted. On the other hand, scaling of I/O circuits has progressed at a slower pace since I/O circuits operate at a higher voltage so as to communicate with off-chip devices. This created a gap in feature dimensions, which has widened with technology scaling, between the low-voltage MOSFETs used in the interior circuits and the high-voltage MOSFETs used in the I/O circuits. In an advanced CMOS process below 100 nm node, this leads to a situation wherein the lateral diffusion from the gate edges into the MOSFET channel of a high-voltage source/drain extension—such as $N_{hvldd}$—is sufficiently large so that it creates a continuous N-type diffusion layer under the gate having a gate length of a low-voltage MOSFET, thus connecting the two adjacent N+ diffusions under the gate. The use of a proper gate material, a heavily-doped P-type (P+) polysilicon in this example, in conjunction with the continuous N-type layer under the gate realizes the bit cell of one embodiment of the present invention.

Figure 1A:
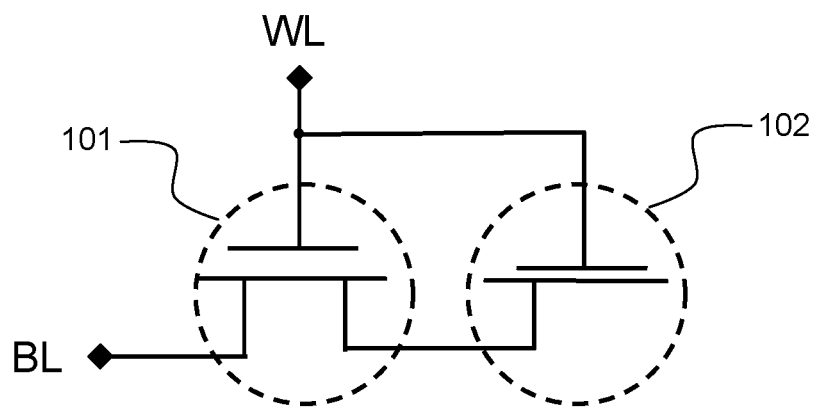
FIG. 1A is a schematic drawing of the one-transistor one-capacitor (1T1C) antifuse OTP memory bit cell found in the prior art.
Figure 1B:
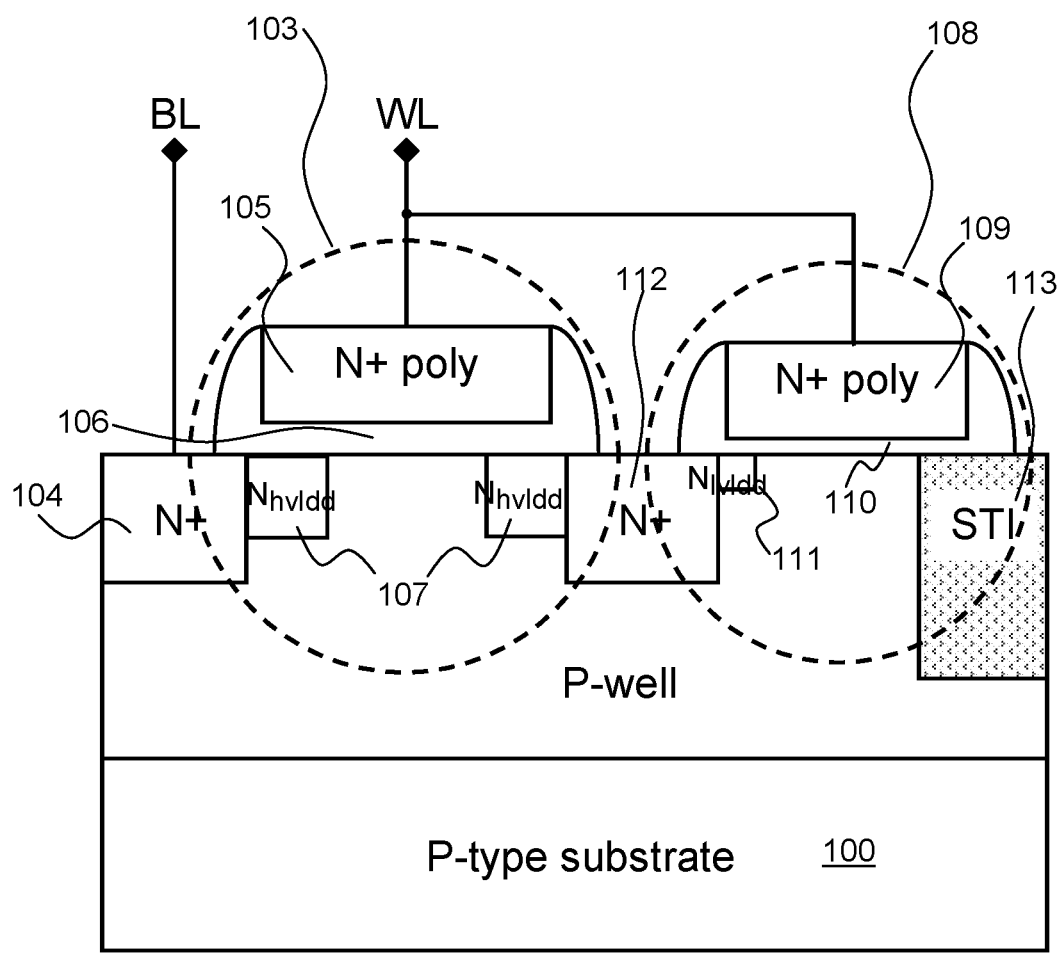
FIG. 1B is an exemplary cross-sectional drawing of the 1T1C bit cell of FIG. 1A.
Figure 2:
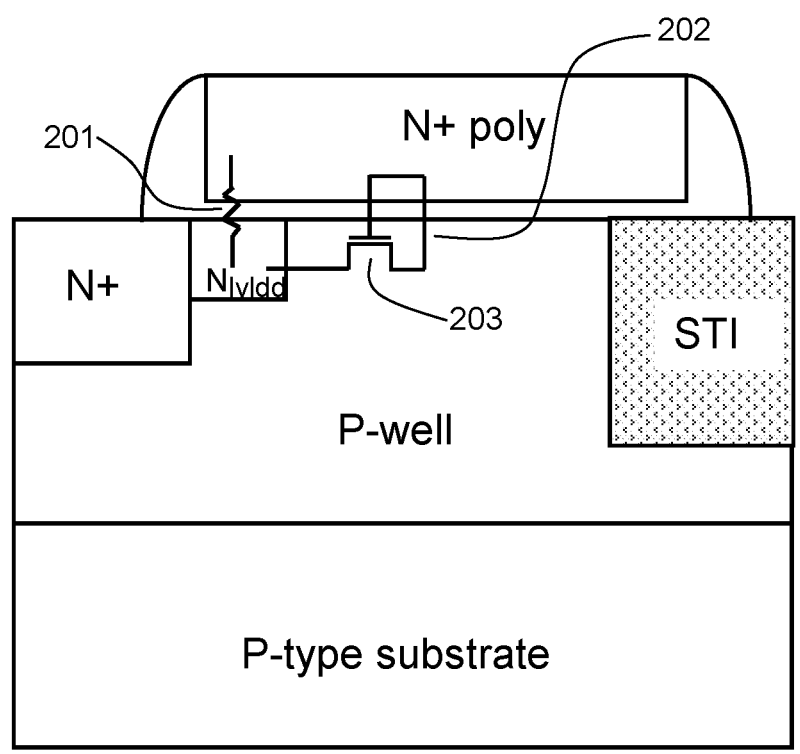
FIG. 2 is a cross-sectional drawing of the MOS capacitor in the 1T1C bit cell wherein the two distinctive locations of gate dielectric breakdown are indicated.
Figure 3A:
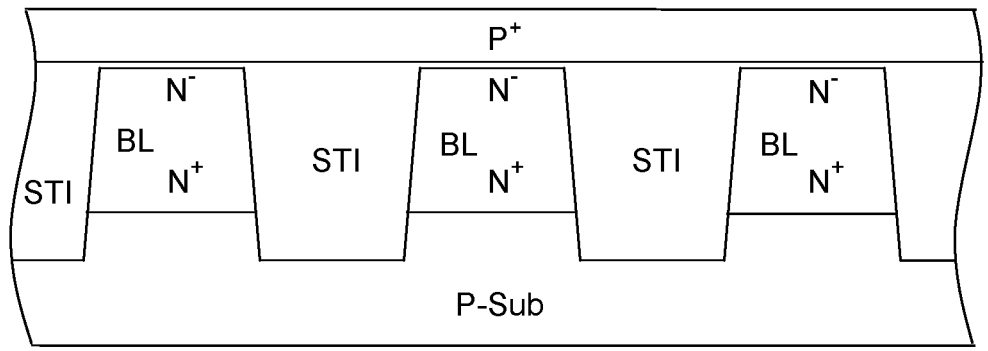
FIG. 3A and FIG. 3B are cross-sectional drawings of the antifuse OTP memory bit cell disclosed in the U.S. Pat. No. 8,330,189, a prior art.
Figure 3B:
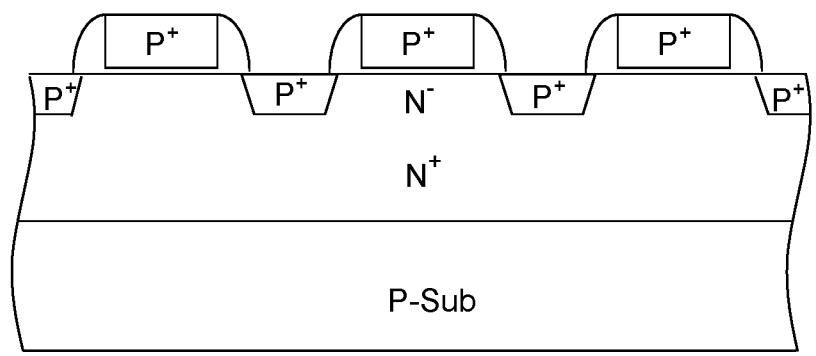
Figure 4:
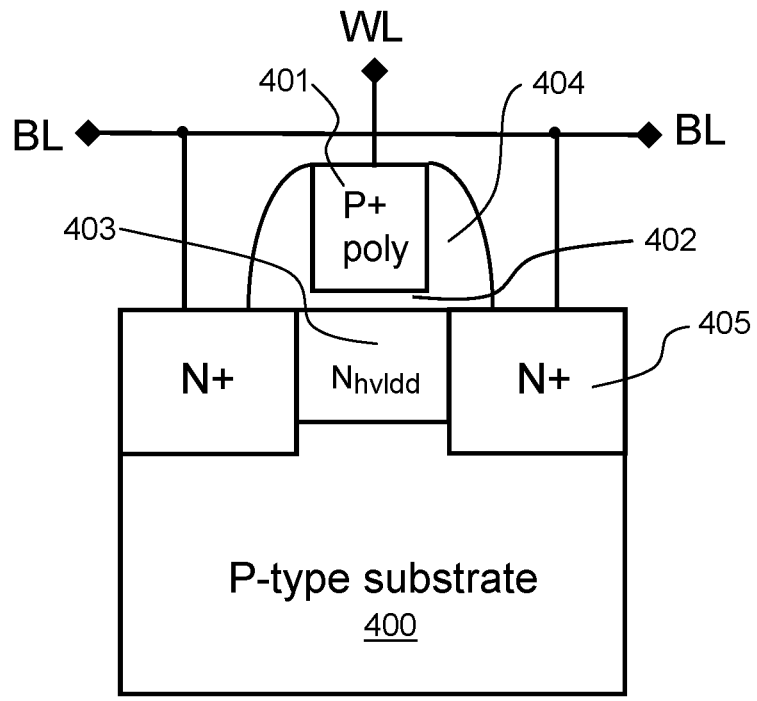
FIG. 4 is an exemplary cross-sectional drawing of an antifuse OTP memory bit cell according to one embodiment of the present invention wherein two adjacent N+ diffusion regions are connected under the gate.

FIG. 4 is an exemplary cross-sectional view of an antifuse OTP memory bit cell according to one embodiment of the present invention described above. The substrate 400 is a P-type non-epitaxial silicon wafer, wherein the substrate doping concentration is $2.0 \times 10^{15}/cm^3 \sim 2.0 \times 10^{16}/cm^3$, a doping concentration commonly found in non-epitaxial silicon wafers. The gate 401 is a P+ polysilicon with a typical doping concentration of $5.0 \times 10^{20}/cm^3 \sim 3.0 \times 10^{21}/cm^3$ and has a gate length of a low-voltage MOSFET. Underneath the gate is a thin gate dielectric 402, i.e., gate dielectric of low-voltage MOSFETs. $N_{hvldd}$ 403 is formed by an ion implantation and subsequent diffusion of an N-type species, typically phosphorus. The ion implantation of $N_{hvldd}$ is performed onto the entire bit cell area into the gate and active areas before the gate sidewall spacers 404 are formed. In an exemplary $N_{hvldd}$ implantation, phosphorous ions are implanted with an implant dosage of $5.0 \times 10^{13}/cm^2$ and implant energy of 30 kilo electron-volt (KeV). The implanted atoms diffuse during subsequent high-temperature processing steps vertically into the substrate and laterally into the MOS capacitor channel. The $N_{hvldd}$ implantation provides a deeper and more graded junction doping profile, needed for high voltage operation of high-voltage MOSFETs, than $N_{lvldd}$ implantation. In contrast, an exemplary $N_{lvldd}$ implantation uses arsenic with a dosage of $5.0 \times 10^{13}/cm^2$ and implant energy of 15 KeV, resulting in a shallow junction with a steep doping profile. It should be pointed out again that in FIG. 4, $N_{hvldd}$ is paired with a low-voltage gate dielectric and P+ gate polysilicon having a low-voltage MOSFET gate length, which deviates from the standard MOSFET structures in CMOS technology, an example of which is shown in FIG. 1B, a cross-sectional drawing of 1T1C bit cell. The embodiment of the present invention shown in FIG. 4 is realized by assembling process and device features available in a CMOS process in a different way from the standard MOSFET structures, and therefore it does not require additional processing steps.

In a typical CMOS process, the lateral junction depth is about one half of the vertical junction depth. Consider as an example a CMOS process of 65 nm generation wherein the minimum gate length of low-voltage MOSFETs intended for 1.2V operation is 65 nm. This means the gate length of P+ polysilicon 401 in FIG. 4 can be as short as 65 nm. The vertical junction depth of $N_{hvldd}$ of high-voltage MOSFETs intended for 3.3V operation is ~120 nm and the lateral junction depth is estimated to be ~60 nm. Therefore, the two $N_{hvldd}$ regions diffusing laterally from the two opposing gate edges would merge in the middle of the MOS capacitor channel and create one continuous N-type layer 403 under the gate. In another exemplary CMOS process of 32 nm generation, the minimum gate length for low-voltage MOSFETs for 0.9V operation is 32 nm. The vertical junction depth of $N_{hvldd}$ for 1.8V operation is ~80 nm and the lateral junction depth is estimated to be ~40 nm. The two $N_{hvldd}$ diffusing laterally from the opposing gate edges would therefore create a continuous N-type layer 403 under the gate. The gate sidewall spacers 404 are formed after the $N_{hvldd}$ ion implantation, followed by N+ source/drain ion implantation, which subsequently forms the N+ source/drain regions 405 after high-temperature processing steps. The N+ source/drain regions are connected to a metal that serves as the bit line and the gate acts as the word line.

Figure 5A:
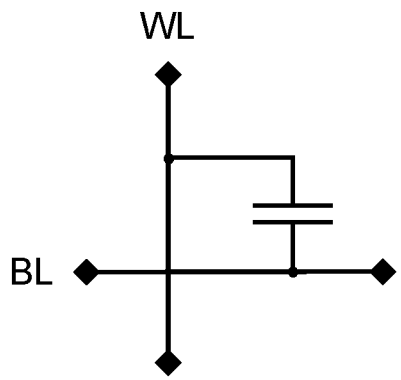
FIG. 5A and FIG. 5B are schematic representations of the bit cell of FIG. 4 in unprogrammed state and in programmed state, respectively.
Figure 5B:
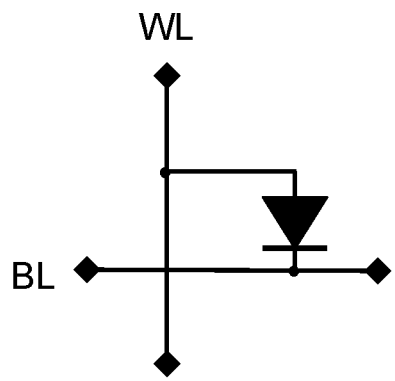

FIG. 5A is a schematic representation of the bit cell shown in FIG. 4 in unprogrammed state, wherein an unprogrammed bit cell is shown as a capacitor. FIG. 5B is a schematic representation of the bit cell shown in FIG. 4 in programmed state. It is to be noted therein the P+ polysilicon is connected to $N_{hvldd}$ layer after gate dielectric breakdown no matter where the breakdown occurs. Hence, a programmed bit cell is represented by a diode between word line and bit line. It is also worth noting there exists a parasitic vertical PNP bipolar transistor in a programmed bit cell of FIG. 4, formed by P+ polysilicon (emitter), $N_{hvldd}$ layer (base) and P-type substrate (collector), though it is not shown in FIG. 5B to avoid obfuscation. During read mode, current flows from the selected word line to the selected bit line of a programmed bit cell through the forward-biased diode in FIG. 5B. In an unprogrammed bit cell of FIG. 5A, there is little current between the selected word line and selected bit line. Details of the bit cell operation in program and read modes are described later in the disclosure. The MOS capacitor, an antifuse element in the bit cell of the present invention, is therefore self-addressable and does not require a separate access transistor. It should also be noted the read current is not influenced by the location of gate dielectric breakdown and as a result, a good read current uniformity can be achieved.

Though the embodiment of FIG. 4 was presented using a non-epitaxial wafer as substrate, those of ordinary skill in the art will recognize the bit cell can be realized with an epitaxial wafer or a silicon-on-insulator (SOI) wafer. It should also be apparent to those of ordinary skill in the art the bit cell can be realized inside a P-well though the embodiment of FIG. 4 was presented using a bit cell formed in a portion of the P-type substrate having an intrinsic doping concentration. It should also be mentioned while a P-type substrate was used in the exemplary embodiment of FIG. 4 and will be used throughout the disclosure for consistency, those of ordinary skill in the art will understand the bit cell can be realized using an N-type substrate or inside an N-well formed in a P-type substrate with an appropriate reversal of conductivity types.

It should be noted that the horizontal and vertical dimensions of the various regions in FIG. 4 and in other drawings of this disclosure, including the thicknesses of its various layers, depth and lateral reach of its doped regions and relative lengths are not necessarily drawn to scale. In some cases, layer thicknesses, junction depths, lengths and other dimensions are exaggerated so as to best illustrate the structural features and/or functional aspects of the present invention. It should also be mentioned not all features employed by standard CMOS process and known to those of ordinary skill in the art are described so as to avoid obfuscation of the key aspects of the disclosure.

Figure 6:
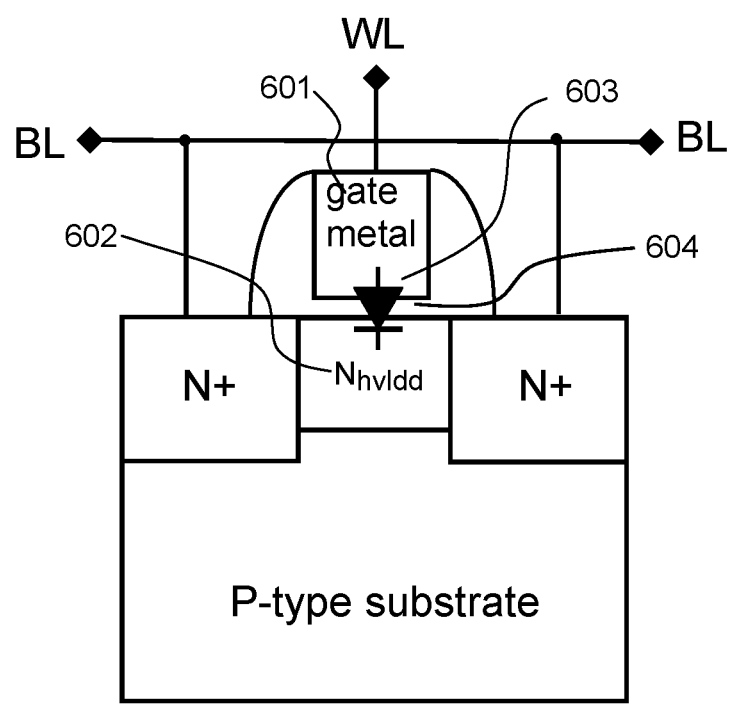
FIG. 6 is a cross-sectional drawing of an antifuse OTP memory bit cell according to another embodiment of the present invention wherein the gate electrode of MOS capacitor in the bit cell is metal.

In advanced CMOS processes below 30 nm node, metal begins to replace heavily-doped polysilicon as gate material. At such advanced process nodes, the gate depletion phenomenon occurring in polysilicon gate, though heavily doped, increases the effective dielectric thickness and impedes MOSFET scaling. Metal gate does not suffer from the gate depletion and therefore the use of metal gate is advantageous in MOSFET scaling in advanced CMOS nodes. In a dual metal gate CMOS process, two distinct metals with different work functions are used, one for the gate of N-channel MOSFET and the other for the gate of P-channel MOSFET, to obtain desired threshold voltages. Therefore, the metal gates of N-channel MOSFET and P-channel MOSFET in a dual metal gate CMOS process take a similar role to N+ polysilicon gate and P+ polysilicon gate, respectively, in silicon gate CMOS technology. The bit cell of the present invention can also be implemented with a dual metal gate CMOS process. FIG. 6 is a cross-sectional drawing of another embodiment of the present invention wherein metal is used as bit cell gate electrode. It should be noted the gate metal 601 for MOS capacitor is the metal used for P-channel MOSFET gate. In a programmed bit cell, the gate metal 601 forms a rectifying contact to underlying $N_{hvldd}$ 602 and thus is schematically represented by a diode 603. Underneath the gate metal 601 is a gate dielectric 604, typically a composite layer of a high dielectric constant (hi-k) material such as hafnium oxide ($HfO_2$) and an interfacial layer. For a bit cell with a metal gate, gate dielectric breakdown refers to the breakdown of either the interfacial layer, or the hi-k dielectric or both. Aside from the use of metal gate and hi-k dielectric/interfacial layer stack, other features and attributes associated with the embodiment of FIG. 4 apply to FIG. 6 as well.

Figure 7:
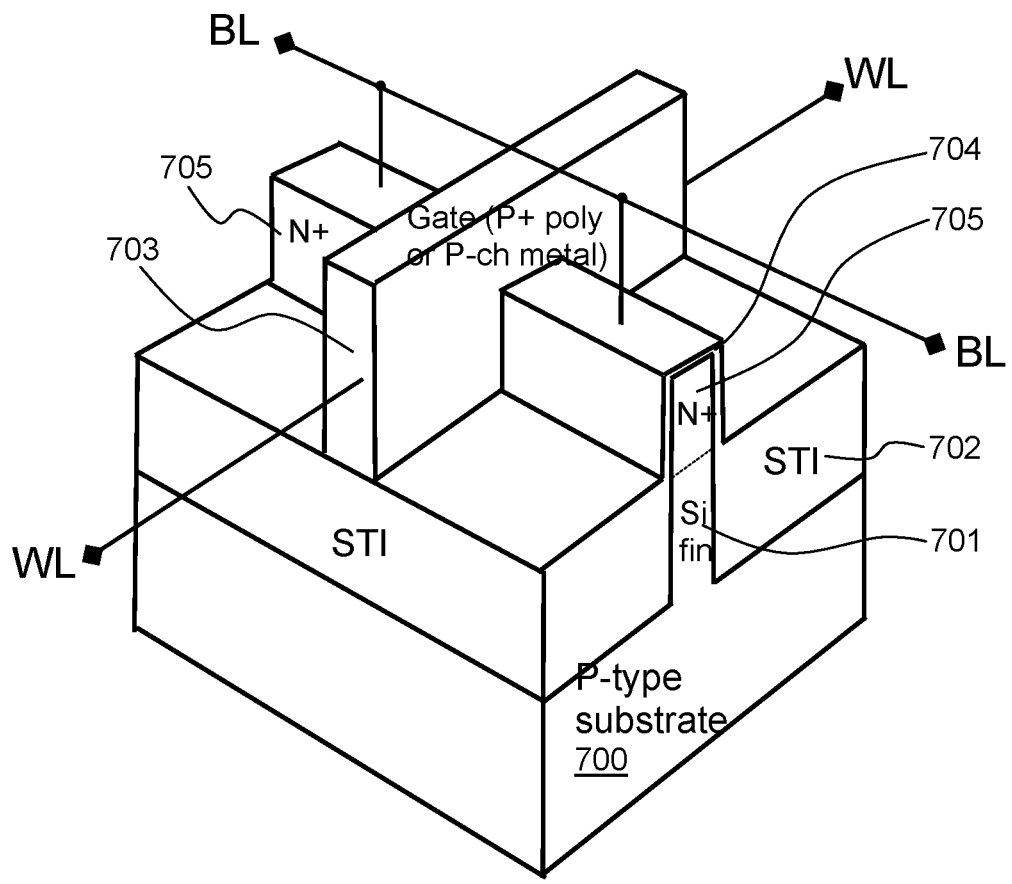
FIG. 7 is a three-dimensional view of an antifuse OTP memory bit cell according to another embodiment of the present invention wherein the bit cell is realized in a silicon fin using a 3-dimensional CMOS process.

As semiconductor technology is further scaled below 20 nm generation, CMOS technology begins to migrate from the conventional two-dimensional (2D) planar MOSFET to three-dimensional (3D) MOSFET, sometimes referred to as fin-FET. The short-channel effects experienced by 2D MOSFETs are barrier to continued scaling at advanced CMOS nodes. In a 3D CMOS process, MOSFETs are formed in a thin slice of semiconductor material extending from the semiconductor substrate and the gate electrode wraps around the fin. As a result, the short-channel effects are mitigated and the device scaling is able to continue. FIG. 7 is a 3D view of a bit cell in another embodiment of the present invention wherein the bit cell is constructed using a 3D MOSFET structure. In an exemplary 3D MOSFET process of FIG. 7, a P-type silicon fin 701 is shaped on a P-type substrate 700 and is isolated from the adjacent silicon fins by shallow trench isolation (STI) 702. The gate electrode 703 is either P-channel metal or P+ polysilicon and wraps around the silicon fin under the gate dielectric 704. The gate is the word line and runs orthogonal to the silicon fin. The N+ source/drain diffusions 705 are formed in the silicon fin on both sides of the gate and are connected to a metal bit line (not shown) that runs parallel to the silicon fin. A N-type layer, created by $N_{hvldd}$ and present inside the silicon fin covered by the gate, connects the two adjacent N+ source/drain diffusions.

Figure 8:
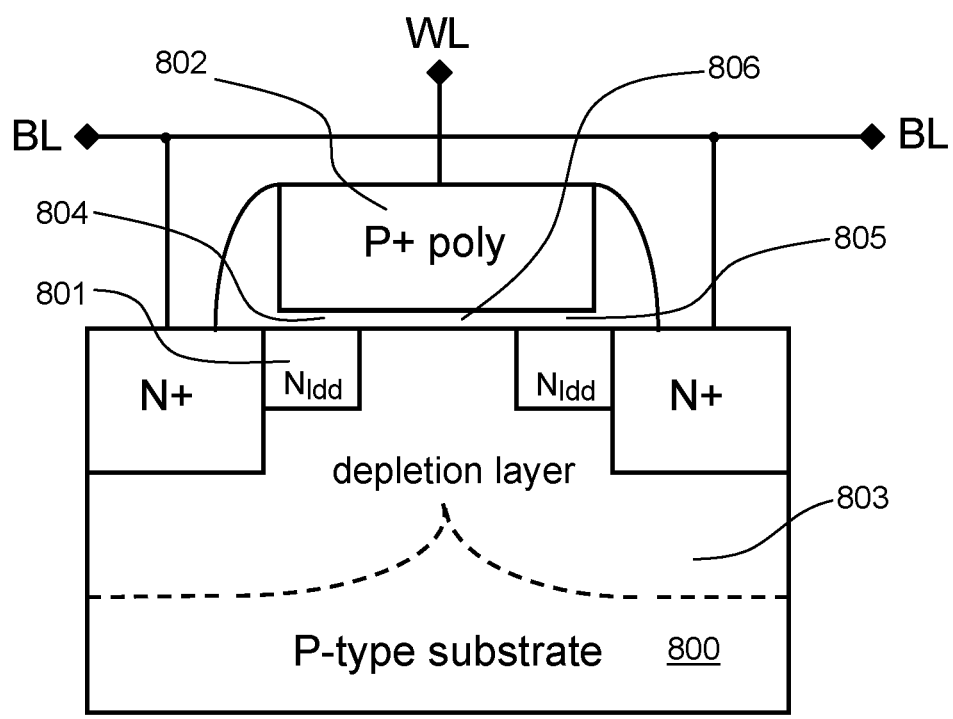
FIG. 8 is a cross-sectional drawing of an antifuse OTP memory bit cell according to another embodiment of the present invention wherein two adjacent N+ diffusion regions are not connected under the gate electrode.

FIG. 8 is a cross-sectional drawing of yet another embodiment of the present invention. A major difference of the bit cell depicted in FIG. 8 from that of FIG. 4 is that N-type lightly-doped drain ($N_{ldd}$) 801, which can be either $N_{hvldd}$ or $N_{lvldd}$, is discontinuous under the gate electrode 802. This happens when the lateral diffusion of $N_{ldd}$ from the gate edge into the MOS capacitor channel is insufficient for the two $N_{ldd}$ layers to merge under the gate or alternatively, the gate length is larger than the sum of the two $N_{ldd}$ lateral junction depths. Also to be noted in FIG. 8 is that the built-in junction depletion layer 803, the depletion layer for 0V junction bias, extends from the N+ and $N_{ldd}$ regions of each side of the gate and completely depletes the MOS capacitor channel. This happens when the doping concentration of the MOS capacitor channel is sufficiently low so that the sum of the two built-in junction depletion layer widths is greater than the gate length. Consider 32 nm CMOS node wherein the gate length is 32 nm. The built-in depletion layer width of N+ and $N_{ldd}$ regions to MOS capacitor channel junction in P-type substrate is greater than 100 nm so the MOS capacitor channel is completely depleted with 0V applied to the N+, P-type substrate and P+ gate.

Figure 9A:
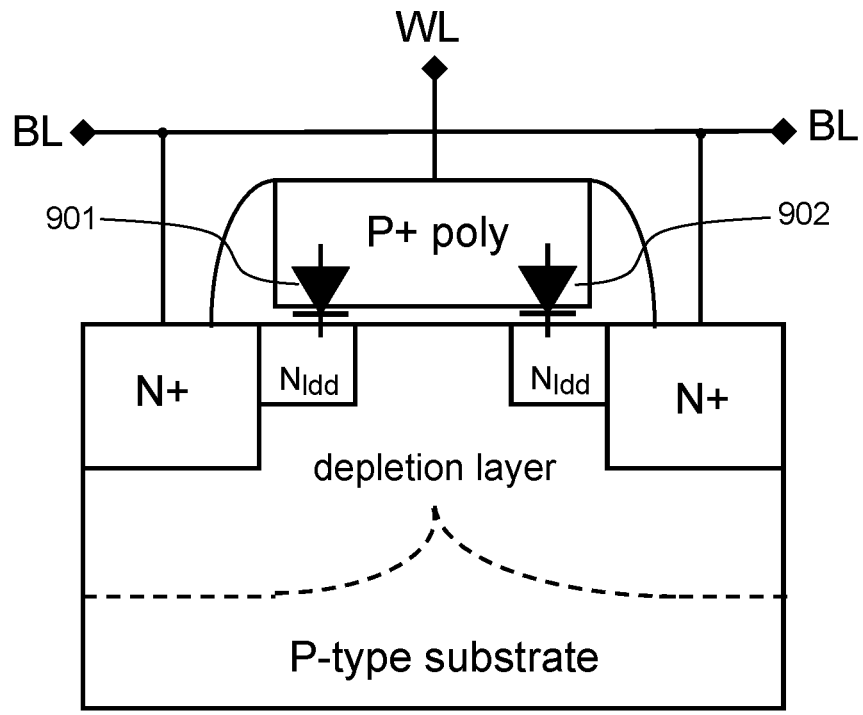
FIG. 9A is a cross-sectional drawing of an antifuse OTP memory bit cell according to the embodiment of FIG. 8 wherein the location of gate dielectric breakdown is in the overlap regions of N+ diffusion with $N_{ldd}$.
Figure 9B:
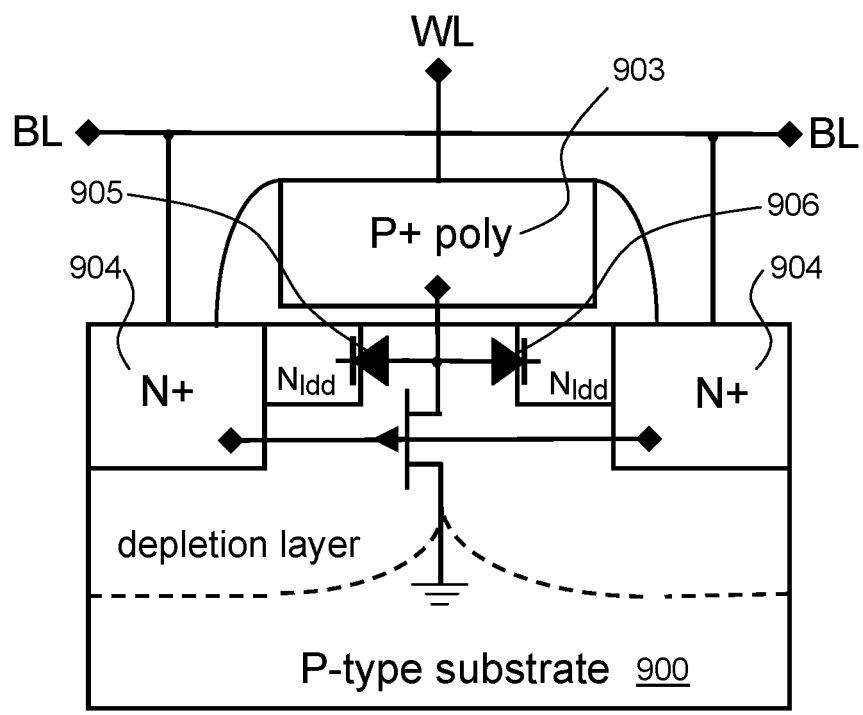
FIG. 9B is a cross-sectional drawing of an antifuse OTP memory bit cell according to the embodiment of FIG. 8 wherein the location of gate dielectric breakdown is in the MOS capacitor channel area.

If the gate dielectric breakdown occurs in the gate/$N_{ldd}$ overlap region 804 or 805 in FIG. 8, the programmed bit cell is represented by a diode 901 or 902 between the word line and bit line as shown in FIG. 9A. If the gate dielectric breakdown occurs in the MOS capacitor channel 806 in FIG. 8, a non-rectifying contact is formed between the P+ gate polysilicon 802 and P-type substrate 800 in FIG. 8. The current flow from the P+ gate polysilicon to P-type substrate in a programmed bit cell is modulated by the junction depletion layer 803. Since the MOS capacitor channel in FIG. 8 is completely depleted by the built-in junction depletion layer 803, the programmed bit cell when gate dielectric breakdown occurs at 806 is modeled by an enhancement-mode P-channel junction FET (JFET) as shown in FIG. 9B wherein the P+ gate polysilicon 903 is the source, N+ diffusions 904 are the gate and P-type substrate 900 is the drain of the P-channel JFET. In addition, a pair of diodes 905 and 906 exists between the word line (P+ gate) and bit line (N+). To read a programmed bit cell, a positive voltage is applied to the selected word line and 0V is applied to the selected bit line. Under this bias condition, the P-channel JFET and the diodes can turn on and conduct current. The amount of current flowing through the JFET and diodes depends on the JFET threshold voltage and diode forward turn-on voltage. There is no current conduction in the unselected bit cells. Thus the MOS capacitor, an antifuse element in the bit cell of the embodiment of the present invention presented in FIG. 8 is self-addressable and does not require a separate access transistor. Details of program and read mode operation of the bit cell of FIG. 8 are described later in the disclosure.

Referring to FIG. 8, though the presentation has been made for the MOS capacitor channel that is completely depleted by the built-in junction depletion layer, it does not have to be completely depleted in order for the MOS capacitor to function as an OTP memory bit cell. If the MOS capacitor channel is only partially depleted by the built-in junction depletion layer, a depletion-mode P-channel JFET is created in a programmed bit cell. In such a case, program and read operations of a bit cell can be performed by applying voltages that are different from those for a fully depleted MOS capacitor channel as explained in detail later in the disclosure.

Figure 10:
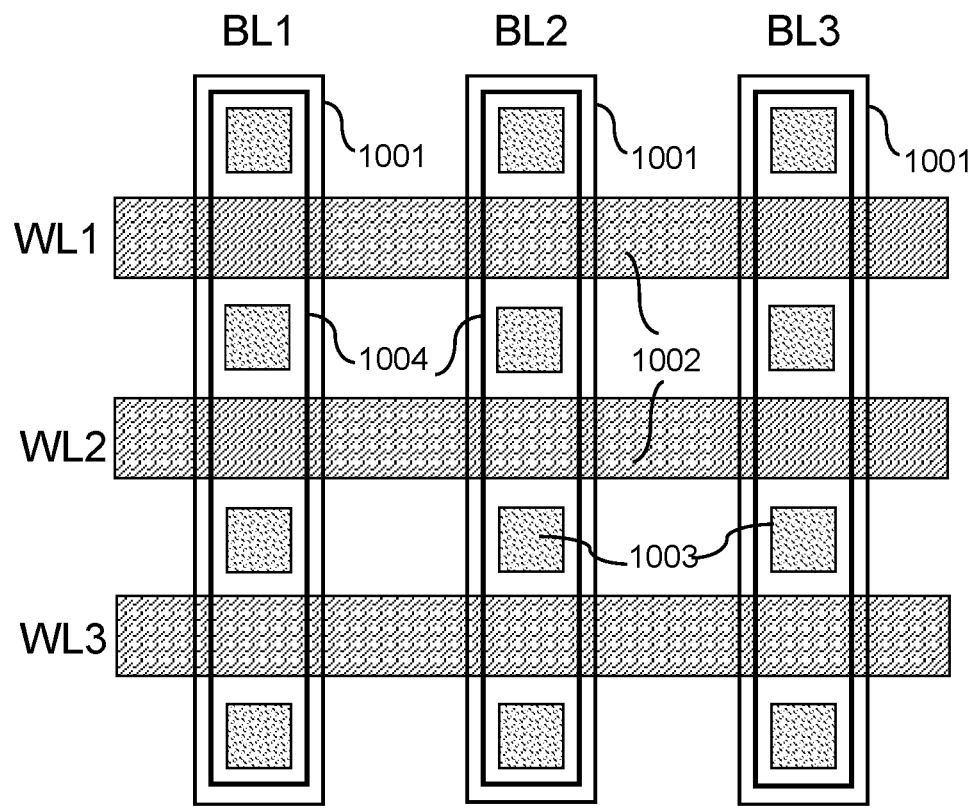
FIG. 10 is a top view of an exemplary layout of a 3×3 memory array designed with the embodiment of the present invention shown in FIG. 4.

FIG. 10 is a top view of an exemplary layout of a 3×3 memory array using the embodiment of the present invention shown in FIG. 4. The active areas 1001 are laid out in the vertical direction and the polysilicon gates 1002 are laid out in the horizontal direction therein but their orientations can be interchanged. N+ diffusions in an active area are connected to a metal 1004 through contacts 1003 forming the bit line and the gate is the word line. The array layout is a crosspoint switch configuration wherein a bit cell exists at each crosspoint of the word line and bit line. Though the bit cell of FIG. 4 is used to create the layout in FIG. 10, those of ordinary skill in the art will understand that bit cells of other embodiments of the present invention can also use the array layout scheme of FIG. 4 to build a memory array.

Figure 11A:
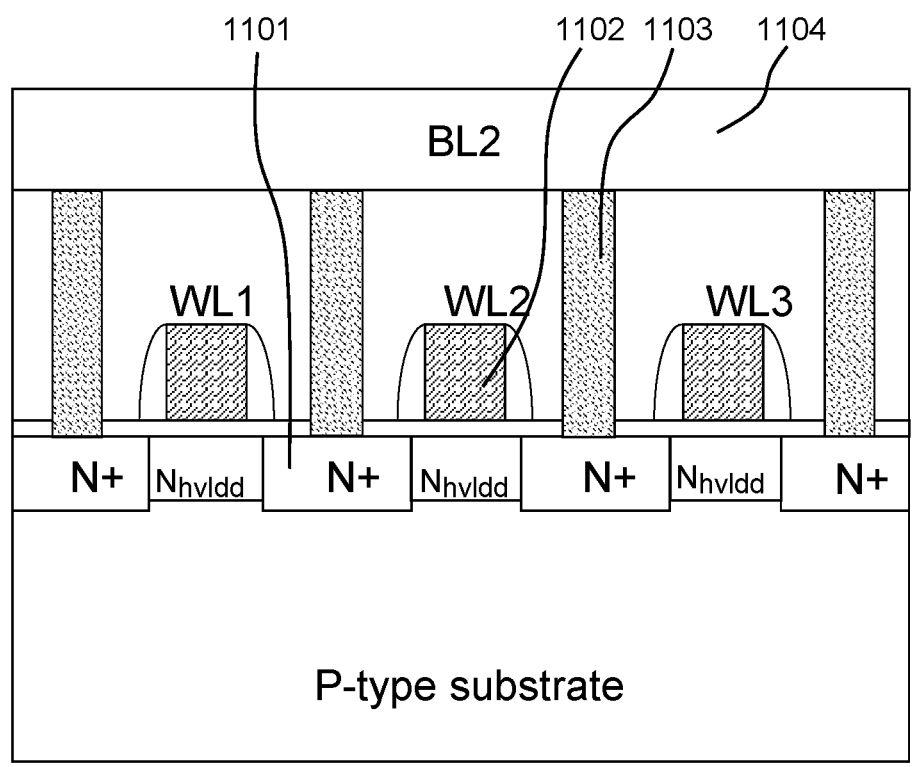
FIG. 11A is a cross-sectional view of FIG. 10 along the bit line direction.
Figure 11B:
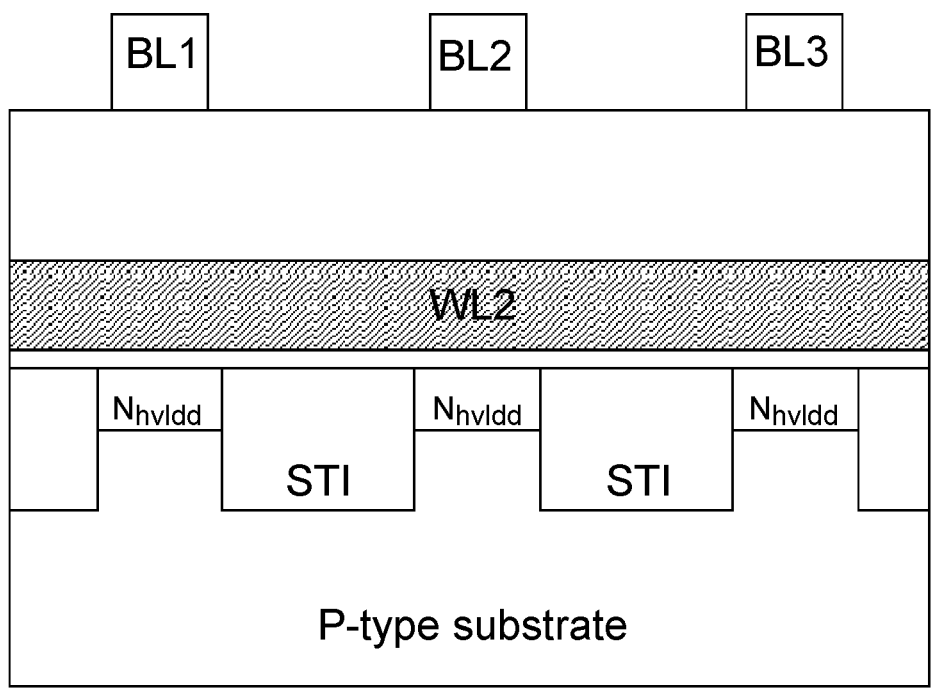
FIG. 11B is a cross-sectional view of FIG. 10 along the word line direction.

Cross-sectional drawings of FIG. 10 are given in FIG. 11A along the bit line BL2 and along the word line WL2 in FIG. 11B. In FIG. 11A, all N+ diffusions 1101 along the bit line, separated by P+ polysilicon gates 1102, are shown connected to the metal bit line BL2 1104 through contact holes 1103 but they don't have to be. Since the N+ diffusions are connected under the gate, a metal bit line can pick up the N+ diffusions only as often as necessary—for example, every other N+ diffusions—thus saving array area, as long as the bit cell performance is not compromised.

Figure 12:
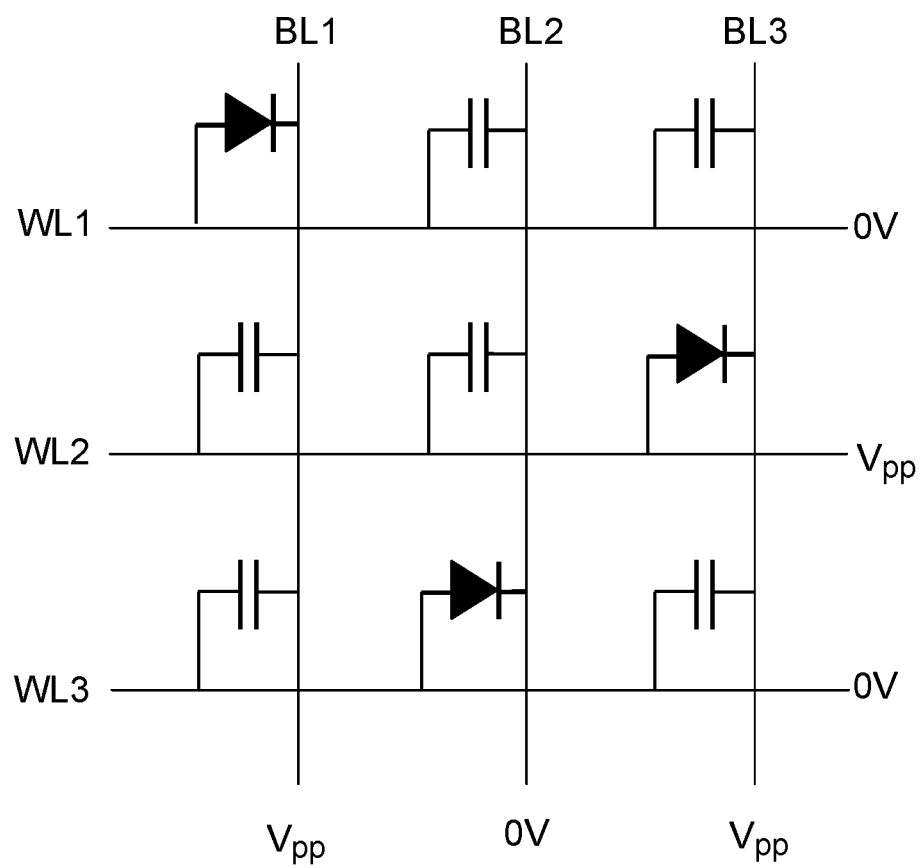
FIG. 12 is an exemplary schematic circuit and bias condition for program mode of a 3×3 memory array built with the embodiment of FIG. 4.

FIG. 12 is a schematic circuit of a 3×3 memory array with an exemplary bias condition for program mode according to the embodiment of the present invention shown in FIG. 4. An unprogrammed bit cell is represented by a capacitor and a bit cell that had already been programmed is represented by a diode. To program the bit cell located at WL2/BL2, a positive program voltage $V_{pp}$ is applied to the selected word line WL2 and 0V is applied to the selected bit line BL2. The unselected word lines WL1 and WL3 are biased to 0V and the unselected bit lines BL1 and BL3 are biased to $V_{pp}$. The value of $V_{pp}$ depends on the thickness and strength of gate dielectric. It ranges from ~3V for a cutting edge CMOS generation of 14 nm to ~6V for 65 nm generation. Under the given bias condition, MOS capacitor channel of the selected bit cell at WL2/BL2 is accumulated with electrons and the bit cell is programmed by subsequent gate dielectric breakdown. In unselected unprogrammed bit cells such as those located at WL1/BL2 and WL3/BL3, the MOS capacitor channels are either at the same voltage as the gate or in a deep depletion mode so that those bit cells are not programmed. In unselected programmed bit cells such as those located at WL1/BL1 and WL2/BL3, the voltage across the diode is 0V or the diode is reverse biased. Thus they draw little or no current and do not disrupt the programming of the bit cell located at WL2/BL2.

Figure 13:
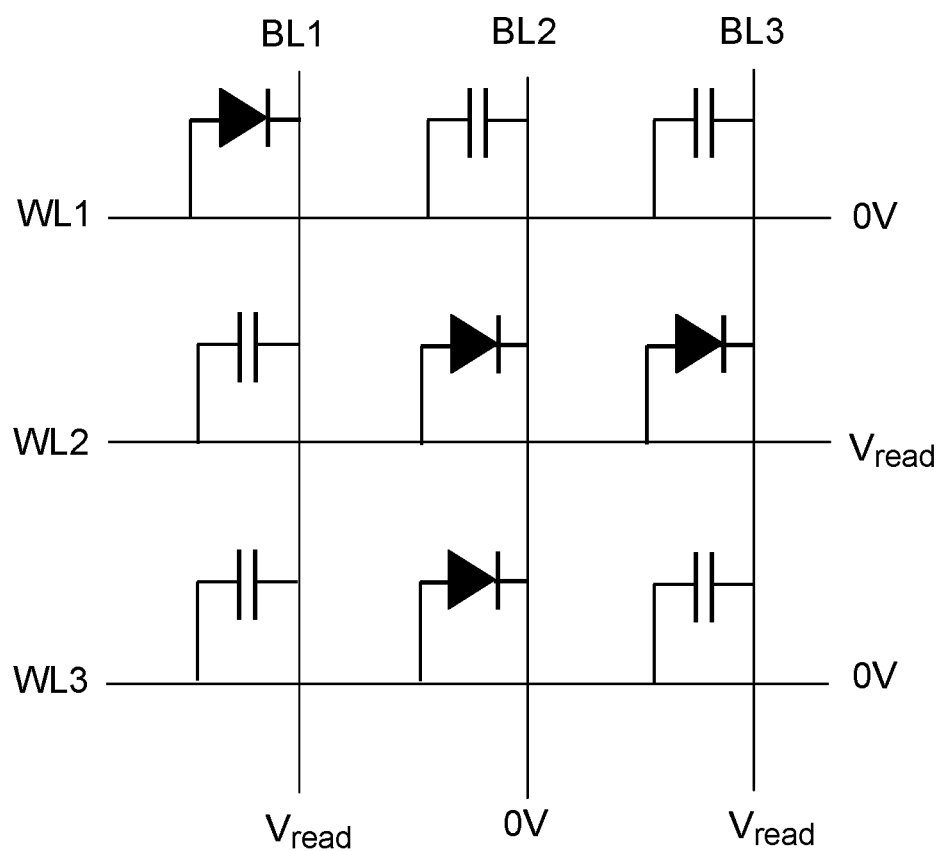
FIG. 13 is an exemplary schematic circuit and bias condition for read mode of a 3×3 memory array built with the embodiment of FIG. 4.

FIG. 13 is a schematic circuit of a 3×3 memory array with an exemplary bias condition for read mode according to the embodiment of the present invention shown in FIG. 4. To read the bit cell located at WL2/BL2, a positive read voltage $V_{read}$ is applied to the selected word line WL2 and 0V is applied to the selected bit line BL2. The unselected word lines WL1 and WL3 are biased to 0V and the unselected bit lines BL1 and BL3 are biased to $V_{read}$. Since the diode turn-on voltage is ~0.7V, a typical value of $V_{read}$ ranges from 0.7V to 1.5V. Under the given bias condition, the diode located at WL2/BL2 is forward biased and current flows from WL2 to BL2. In unselected programmed bit cells, the voltages across diodes are 0V or the diodes are reverse biased so that no or little current flows between the word line and bit line.

Figure 14:
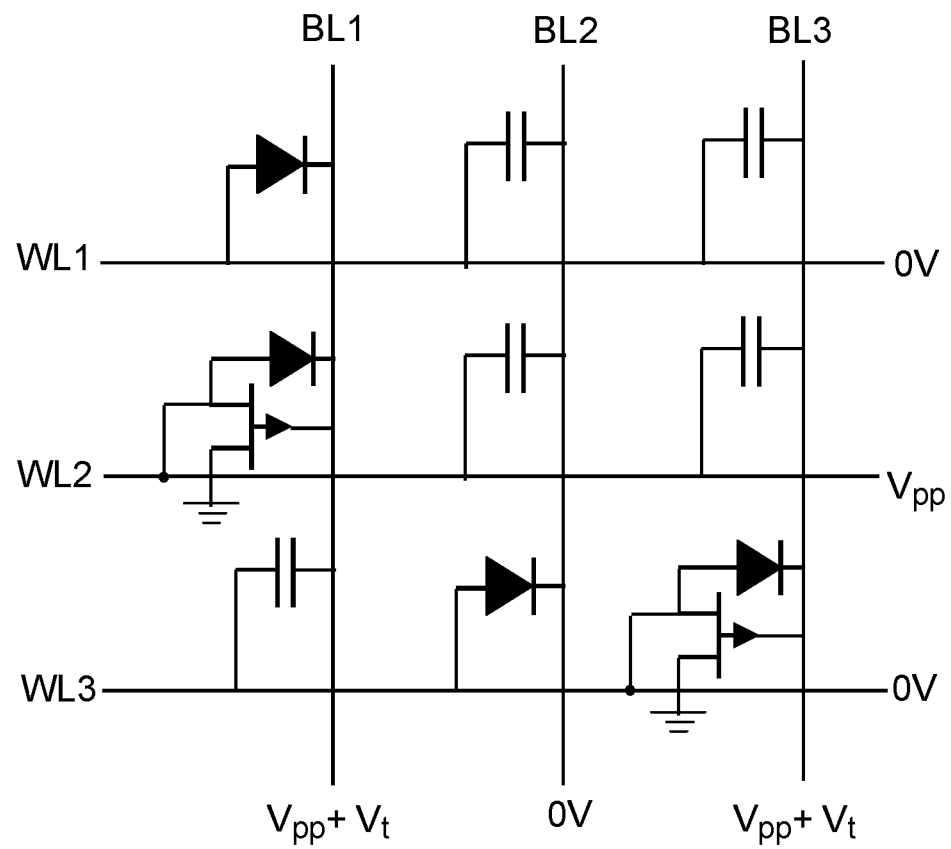
FIG. 14 is an exemplary schematic circuit and bias condition for program mode of a 3×3 memory array built with the embodiment of FIG. 8.

FIG. 14 is a schematic circuit of a 3×3 memory array with an exemplary bias condition for program mode according to another embodiment of the present invention shown in FIG. 8. An unprogrammed bit cell is again represented by a capacitor. A bit cell that had already been programmed is represented either by a diode only or by a combination of a JFET and a diode depending on the location of gate dielectric breakdown. To program a bit cell located at WL2/BL2, a positive program voltage $V_{pp}$ is applied to the selected word line WL2 and 0V is applied to the selected bit line BL2. The unselected word lines WL1 and WL3 are biased to 0V and the unselected bit lines BL1 and BL3 are biased to $V_{pp}+V_t$ wherein $V_t$ is the threshold voltage required to turn off the JFET. If the JFET is an enhancement-mode device, such as the one shown in FIG. 8, $V_t$ is 0V because the JFET is in off-state when $V_{gs}$ is 0V. If the JFET is a depletion-mode device, $V_t$ is a positive value so as to turn off JFETs in unselected bit cells. Under the given bias condition, the MOS capacitor channel in the selected bit cell located at WL2/BL2 is inverted and the bit cell is programmed. In unselected unprogrammed bit cells such as those located at WL1/BL2 and WL1/BL3, the MOS capacitor channels are either at the same voltage as the gate or in a deep depletion mode so that those bit cells are not programmed. In unselected programmed bit cells such as those located at WL1/BL1, WL2/BL1, and WL3/BL3, diodes are reverse biased and the JFETs are in off-state. Thus they draw little current and do not disrupt the programming of the bit cell located at WL2/BL2.

Figure 15:
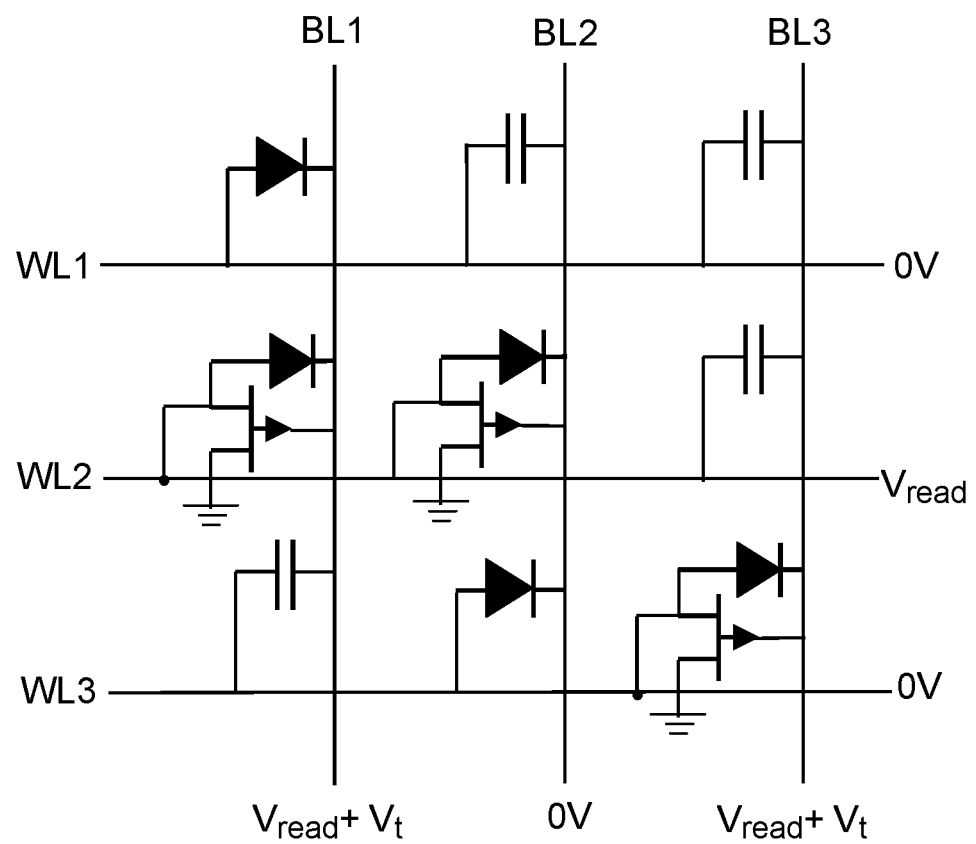
FIG. 15 is an exemplary schematic circuit and bias condition for read mode of a 3×3 memory array built with the embodiment of FIG. 8.

FIG. 15 is a schematic circuit of a 3×3 memory array with an exemplary bias condition for read mode according to the embodiment of the present invention shown in FIG. 8. To read a bit cell located at WL2/BL2, a positive read voltage $V_{read}$ is applied to the selected word line WL2 and 0V is applied to the selected bit line BL2. The unselected word lines WL1 and WL3 are biased to 0V and the unselected bit lines BL1 and BL3 are biased to $V_{read}+V_t$. Under the given bias condition, the diode located at WL2/BL2 is forward biased and current flows from WL2 to BL2. Whether the JFET also conducts current or not depends on the JFET type and the magnitude of $V_{read}$. If the JFET is an enhancement-mode device, the JFET can remain in off-state with a proper choice of $V_{read}$ value, in which case the read current is mainly due to the diode forward current. In unselected bit cells, the diodes and JFETs are in off-state and conduct little or no current.

While various embodiments of the present invention have been described, it should be understood that they have been presented by way of example, and not limitation. It will be apparent to persons skilled in the relevant art that various changes in form and detail may be made therein without departing from the spirit and scope of the invention. The scope of the invention should, therefore, be determined not with reference to the above description, but instead by reference to the appended claims, along with the full scope of equivalents to which such claims are entitled.

What is claimed is:
1. A semiconductor one-time programmable memory bit cell comprising:
   an active area of a first conductivity type disposed in a semiconductor substrate;
   a gate dielectric layer disposed over said active area;
   a gate electrode disposed over said gate dielectric and across said active area;
   diffusion regions of a second conductivity type disposed in said active area not covered by said gate electrode;
   diffusion layers of the second conductivity type under said gate electrode created by lateral diffusion of said diffusion regions not connecting said diffusion regions under said gate electrode;
   a metal line connected to said diffusion regions of the second conductivity type through contact holes disposed on said active area; and
   STI regions disposed in said semiconductor substrate,
   wherein said gate electrode is polysilicon or metal and forms a rectifying contact to said diffusion layer of the second conductivity type or forms a non-rectifying contact to said active area of the first conductivity type after a breakdown of said gate dielectric, said metal line is bit line extending in the direction of said active area, said gate electrode is word line extending in the direction orthogonal to said metal line, and said active area is separated from neighboring active areas by said STI regions.

2. The memory bit cell of claim 1 wherein said active area under said gate electrode is completely depleted by built-in junction depletion regions, said rectifying contact is a diode between word line and bit line and said non-rectifying contact forms an enhancement-mode JFET between said gate electrode and said substrate in addition to diodes between word line and bit line in a programmed bit cell.

3. The memory bit cell of claim 1 wherein said active area under said gate electrode is partially depleted by built-in junction depletion regions, said rectifying contact is a diode between word line and bit line and said non-rectifying contact forms a depletion-mode JFET between said gate electrode and said substrate in addition to diodes between word line and bit line in a programmed bit cell.

4. The memory bit cell of claim 1 wherein said active area is disposed in a portion of said semiconductor substrate having an intrinsic doping concentration.

5. The memory bit cell of claim 1 wherein the first conductivity type is P-type and the second conductivity type is N-type; or vice versa.

6. The memory bit cell of claim 1 wherein said active area is disposed inside a well disposed in said semiconductor substrate.

7. The memory bit cell of claim 1 wherein said gate electrode is a polysilicon of the first conductivity type.

8. The memory bit cell of claim 1 wherein the bit cell is a two-dimensional planar MOS structure.

9. The memory bit cell of claim 1 wherein the bit cell is a three-dimensional MOS structure.

10. A semiconductor one-time programmable memory bit cell comprising:
- an active area of a first conductivity type disposed in a semiconductor substrate;
- a gate dielectric layer disposed over said active area;
- a gate electrode disposed over said gate dielectric and across said active area;
- diffusion regions of a second conductivity type disposed in said active area not covered by said gate electrode;
- a diffusion layer of the second conductivity type under said gate electrode created by lateral diffusion of said diffusion regions connecting said diffusion regions under said gate electrode;
- a metal line connected to said diffusion regions of the second conductivity type through contact holes disposed on said diffusion regions; and
- shallow trench isolation (STI) regions disposed in said semiconductor substrate, wherein said gate electrode is polysilicon or metal used for the gate of MOSFETs of which source/drain diffusions are of the first conductivity type in a dual metal gate CMOS process, and forms a rectifying junction with said diffusion layer of the second conductivity type after a breakdown of said gate dielectric, said metal line is bit line extending in the direction of said active area, said gate electrode is word line extending in the direction orthogonal to said metal line, and said active area is separated from neighboring active areas by said STI regions.

11. The memory bit cell of claim 10 wherein said metal line makes contact to said diffusion regions of the second conductivity type in said active area only as often as needed.

12. The memory bit cell of claim 10 wherein said active area is disposed in a portion of said semiconductor substrate having an intrinsic doping concentration.

13. The memory bit cell of claim 10 wherein said metal line makes contact to each said diffusion region of the second conductivity type in said active area.

14. The memory bit cell of claim 10 wherein said active area is disposed inside a well disposed in said semiconductor substrate.

15. The memory bit cell of claim 10 wherein the first conductivity type is P-type and the second conductivity type is N-type; or vice versa.

16. The memory bit cell of claim 10 wherein said gate electrode is a polysilicon of the first conductivity type.

17. The memory bit cell of claim 10 wherein the bit cell is a two-dimensional planar MOS structure.

18. The memory bit cell of claim 10 wherein the bit cell is a three-dimensional MOS structure.

* * * * *